United States Patent [19]

Tanaka et al.

[11] Patent Number: 5,336,587
[45] Date of Patent: Aug. 9, 1994

[54] METHOD OF MANUFACTURING MAIN PLATES FOR EXPOSURE PRINTING

[75] Inventors: Hiroshi Tanaka, Fukaya; Makoto Kudou, Kumagaya, both of Japan

[73] Assignee: Kabushiki Kaisha Toshiba, Kawasaki, Japan

[21] Appl. No.: 15,291

[22] Filed: Feb. 8, 1993

Related U.S. Application Data

[63] Continuation of Ser. No. 733,015, Jul. 19, 1991, abandoned, which is a continuation of Ser. No. 354,288, May 19, 1989, abandoned.

[30] Foreign Application Priority Data

May 24, 1988 [JP] Japan .................. 63-124911

[51] Int. Cl.⁵ .............................................. G03C 5/00
[52] U.S. Cl. ........................................ 430/322; 430/5;
430/23; 430/24; 430/320; 430/326
[58] Field of Search ................. 430/5, 23, 24, 322, 430/326, 330

[56] References Cited

U.S. PATENT DOCUMENTS

| | | |
|---|---|---|
| 3,973,964 | 8/1976 | Lange . |
| 3,973,965 | 8/1976 | Suzuki et al. ............ 430/23 |
| 4,339,516 | 7/1982 | van der Waal et al. ...... 430/24 |
| 4,341,591 | 7/1982 | Tamutus .................. 430/23 |
| 4,738,907 | 4/1988 | Shigetomi et al. ......... 430/5 |
| 4,755,257 | 7/1988 | Yamamoto et al. ......... 430/23 |
| 4,778,747 | 10/1988 | Ohta et al. .............. 430/5 |
| 4,861,422 | 8/1989 | Kudou et al. ............. 430/23 |
| 5,066,561 | 11/1991 | Pampalone ............... 430/326 |

FOREIGN PATENT DOCUMENTS 53-33568 3/1978 Japan .
59-73834 4/1984 Japan .

*Primary Examiner*—Jack P. Brammer
*Attorney, Agent, or Firm*—Cushman, Darby & Cushman

[57] ABSTRACT

In order to manufacture a pair of main plates closely contacted with both the faces of a member to be exposed to light, patterns are drawn on a pair of original dry plates by a main pattern drawing device and developed. Thereafter, the developed pattern formed on one of the pair of original dry plates is successively transcribed even times in such a manner that a transcribed pattern having just formed on a newly supplied dry plate at a prior transcription is now transcribed to a fleshly supplied dry plate at a next transcription, and the developed pattern formed on the other one of the pair of original dry plate is successively transcribed odd times in such a manner that a transcribed pattern having just formed on a newly supplied dry plate at a prior transcription is now transcribed to a fleshly supplied dry plate at a next transcription, thereby forming a pair of main plates.

2 Claims, 5 Drawing Sheets

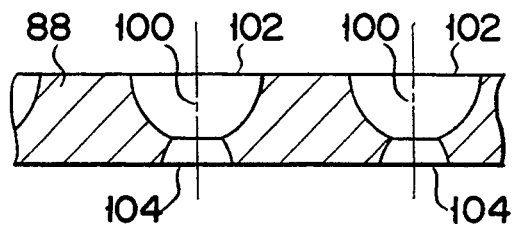
F I G. 5
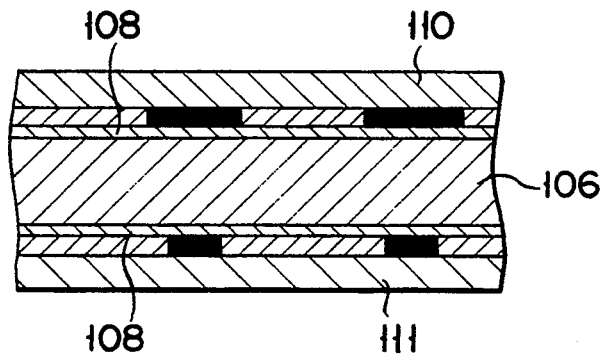
F I G. 6

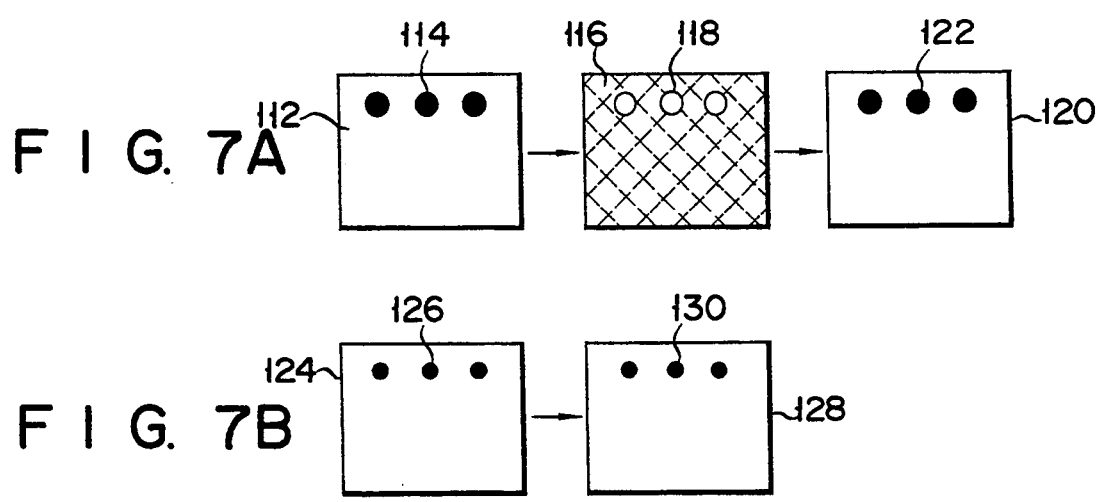
FIG. 7A
FIG. 7B
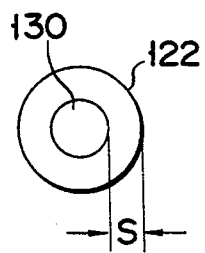
FIG. 8

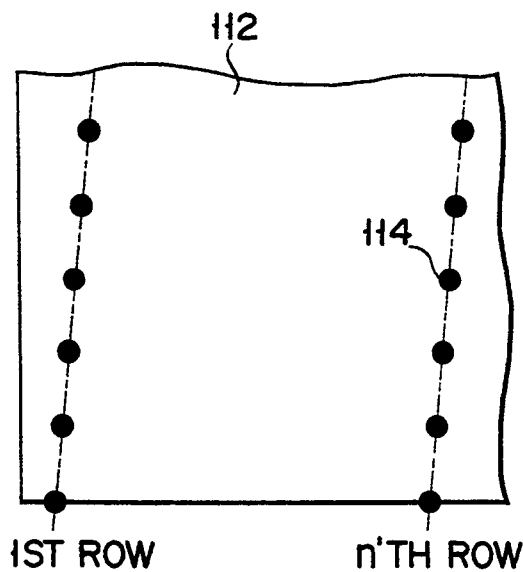
F I G. 9A
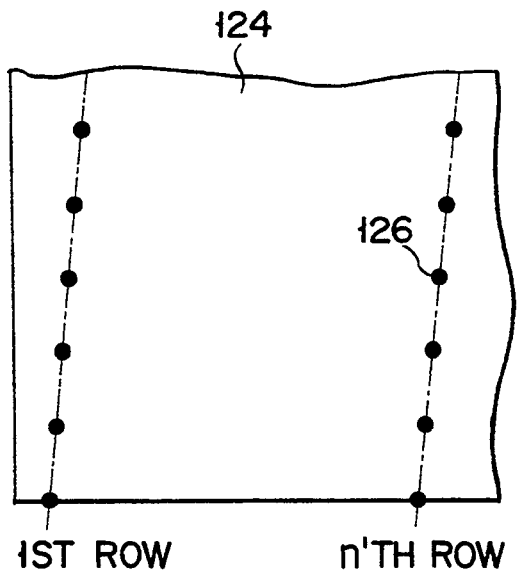
F I G. 9B
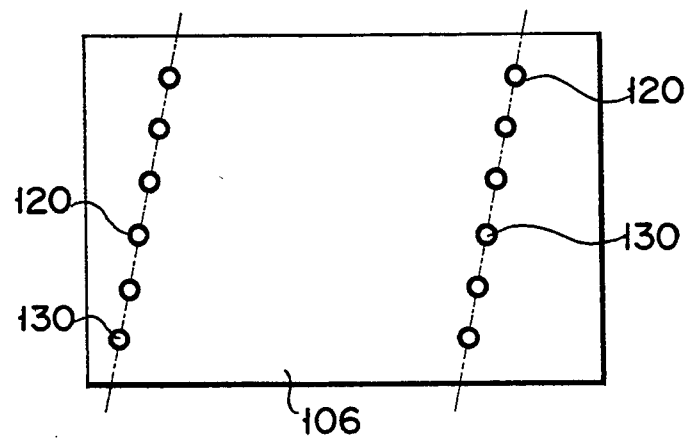
F I G. 10

METHOD OF MANUFACTURING MAIN PLATES FOR EXPOSURE PRINTING

This is a continuation of application Ser. No. 07/733,015, filed on Jul. 19, 1991, which was abandoned upon the filing hereof, which in turn is a continuation of application Ser. No. 07/354,288 filed May 19, 1989, now abandoned.

BACKGROUND OF THE INVENTION

1. Field of the Invention

This invention relates to a method of manufacturing main plates for exposure printing, and particularly to a method of manufacturing a pair of main plates for printing a predetermined pattern on photo-sensitive layers respectively formed on both faces of a shadow mask of a color cathode ray tube when the shadow mask is manufactured by a photo-etching method.

2. Description of the Related Art

A color cathode ray tube of shadow mask type is provided with a panel having a substantially rectangular face plate and a skirt extending from a peripheral edge of the face plate, a funnel connected to the panel, and a neck continuous to the funnel. The panel, funnel and neck holds the interior of the color cathode ray tube in vacuum. Within the neck is housed an electric gun assembly which generates electron beams. A deflection yoke which generates magnetic fields is mounted on the outer lateral surfaces of the funnel and the neck. A phosphor screen is formed on the inner face of the face plate of the panel. In the tube, a substantially rectangular shadow mask is disposed to be separated from the face plate at a predetermined distance so as to face the phosphor plate. The shadow mask is made of a thin metal plate and is formed with a great number of apertures. A mask frame surrounds the shadow mask. A plurality of elastically deformable mask supports are welded to the frame. Stud pins engaged with the supports are provided on the inner face of the panel.

With the color ray tube of shadow mask type, the three electron beams emitted from the electron gun assembly are deflected horizontally and vertically by the magnetic field generated by the deflection yoke, and thereafter are converged into apertures of the shadow mask. The electron beams converged at the apertures of the shadow mask are landed on the phosphor screen formed on the face plate of the panel. The phosphor screen has three kinds of phosphor stripes which are alternately arranged. When these phosphor stripes are shot by the three electron beams passing through the apertures of the shadow mask, these phosphor stripes emit three color lights of red, green and blue. In other words, the apertures of the shadow mask serve to direct the three beams to the predetermined phosphor stripes which respectively emit red, green and blue lights.

The shadow mask has a great number of apertures which open at the side of the phosphor screen and at the side of the electron gun. The openings of the apertures at the side of the phosphor screen are larger than the openings of the apertures at the side of the electron gun, and the approximately middle portion of the holes has the minimum diameter, such that each aperture has a so-called drum shape.

The apertures of the shadow mask are formed by the photo-etching method. The shadow mask is made of a plate-like shadow mask material of low carbon steel or the like. Photo-sensitive layers are formed on both the faces of the shadow mask material. A pair of main plates each formed with a pattern corresponding to the apertures of the shadow mask are closely contacted with the respective photo-sensitive layers, and thereafter these layers are exposed to light, whereby the patterns of the main plates are printed on the photo-sensitive layers on both the faces of the shadow mask. After the exposed photo-sensitive layers have been developed, the unexposed portions are removed from the photo-sensitive layers. Accordingly, resist layers which have patterns corresponding to the patterns of the main plates are formed on the shadow mask material. Then, the shadow mask material is etched at its both faces to form apertures which penetrate the shadow mask material.

In order that apertures are formed by etching both the faces of the shadow mask material as described above, the centers of each pair of the etched concave portions in both the faces of the shadow mask, which are deepened and finally merge, must be aligned. In view of the manufacturing technique, however, it is extremely difficult that the positions of the patterns formed on each main plate coincide with each other over the overall shadow mask.

A pair of main plates will be manufactured as follows:

FIG. 1A shows a method of manufacturing a main plate to be closely contacted with the face of a shadow mask material at the side of the phosphor screen, and FIG. 1B illustrates how to fabricate a main plate to be closely contacted with the face of the shadow mask material at the side of the electron gun.

As shown in FIG. 1A, a pattern 24 for etching the face of the shadow mask material at the side of the phosphor screen is drawn by a pattern drawing device on a negative dry plate 22. The dry plate 22 is developed to form a first negative pattern plate at the side of the phosphor screen. Next, a similar negative dry plate 26 is closely contacted with the first negative pattern plate at the side of the phosphor screen and printed. By developing the dry plate 26, a positive pattern 28 is formed. Thus, a positive pattern plate having the positive pattern 28 is manufactured which is used as a master. Further, a negative dry plate 30 is closely contacted with the positive pattern plate and printed, and the development of the negative dry pattern 30 creates a pattern 32, whereby a second negative pattern plate having the pattern 32 at the side of the phosphor screen is formed which is used as a first main plate for forming the apertures of a shadow mask.

A pattern 36 for etching the face of the shadow mask material at the side of the electron gun is drawn by the pattern drawing device on a negative dry plate 34 as shown in FIG. 1B. The dry plate 34 is developed to form a first negative pattern plate at the side of the electron gun. Next, a similar negative dry plate 38 is closely contacted with the first negative pattern plate at the side of the electron gun and printed. By developing the dry plate 38, positive pattern 40 is formed, whereby a positive pattern plate is manufactured which is used as a master. A negative dry plate 42 is closely contacted with this positive pattern and printed. The dry plate 42 is developed to form a pattern 44, whereby a second negative pattern plate having the pattern 44 at the side of the electron gun is formed which is used as a second main plate for forming the apertures of a shadow mask.

There are two reasons why each pair of main plates are manufactured by the above-described method.

First, since the image of the first negative pattern plate is inverted and the positive pattern plate is produced, inequality of patterns can be easily found which might be caused by such defects as small deviation in pattern dimensions and irregularity of the patterns. It should be noted that negative patterns formed by the pattern drawing device have a high light transmittance, making it difficult to find the above-mentioned defects, whereas the above-described positive patterns have a low light transmittance, making it relatively easy to find the above defects.

Secondly, when the positive pattern plates are used as masters, a great number of main plates can be directly produced.

With the shadow mask of a conventional color cathode ray tube used for a commercial purpose, apertures with a required shape and accuracies can be formed by means of a pair of main plates made by the above-mentioned method. Since, however, with the shadow mask of a color cathode ray tube such as display tube, in which a high resolution is required, the apertures are small and arranged at a small pitch. Accordingly, it is difficult to form apertures with a required shape and accuracies in main plates manufactured by the above method. It is because positional displacement tolerances are small for a pair of main plates. In other words, it is because a small positional displacement tolerance is allowed between the pattern on the shadow mask at the side of the phosphor screen which corresponds to the pattern of the first main plate bearing the apertures at the side of the phosphor screen, as one party, and the pattern on the shadow mask at the side of the electron gun which corresponds to the pattern of the second main plate bearing the apertures at the side of the electron gun, as the other party. For this purpose, the deviation of alignment between those etched concave portions in both the faces of the shadow mask, which are formed from the patterns of the two main plates must be less than 3 microns. A factor which causes such displacement between the patterns of a pair of main plates is that a problem exists in the way in which the patterns are described on a first dry plate by a pattern drawing device when the paired main plates are manufactured. In more detail, when a pattern drawing device is used, patterns are drawn in the same direction of the order of the rows of the patterns, that is, from the first row to the n'th row (n>1) on a pair of dry plates. When the patterns are drawn on dry plates at an angle even slightly different from the angle required for the pattern, the patterns of the paired dry plates are drawn similarly in a state inclined from the required angle due to the function and the drawing accuracy of the main pattern drawing device. In this case, the positional displacement between the upper end and the lower end of the patterns in the outermost n'th row of the shadow mask for a 20-inch color cathode ray tube, for example, is 5 to 7 microns. Patterns are drawn by the main pattern drawing device on both dry plates with their emulsion faces disposed upward, and thereafter both dry plates are placed on the other dry plates such that their emulsion faces are directed to those of the other dry plates, and the patterns of both the dry plates are transcribed to the other dry plates to form positive pattern plates each having a positive pattern. The pattern of the positive pattern plate is also transcribed to further dry plates, thereby manufacturing a pair of main plates.

FIGS. 2 and 3 show a pattern formed on a main plate closely contacted with a shadow mask material when a shadow mask is manufactured. When a pair of main plates are used for printing a shadow mask, the emulsion faces formed with patterns are directed to the photo-sensitive layers of the corresponding faces of a shadow mask material and are closely contacted therewith. Upon printing the patterns on the shadow mask material, the first and second main plates are directed to the corresponding faces of the shadow mask material and placed thereon such that the pattern in the first row on the first main plate and the pattern of the last row on the second main plate form, on the shadow mask material, apertures which coincide with each other. If the rows of the patterns to be formed on the shadow material are inclined from the required angle, the inclinations of these rows of the patterns on the first and second main plates are reversely directed as shown in FIG. 2, because the two patterns face the corresponding faces of the shadow mask material. As a result, each pair of patterns on the shadow mask material are greatly displaced from each other as shown in FIG. 3.

SUMMARY OF THE INVENTION

The object of this invention is to provide a method of manufacturing main plates for exposure printing in which the patterns formed on a pair of main plates can accurately coincide with each other on both the faces of a member to be exposed to light when the patterns are printed on photo-sensitive layers formed on both the faces of the member.

The method of manufacturing main plates for exposure printing comprises the step of drawing a pattern on each of a pair of original dry plates and developing the pattern on each of the pair of original dry plates, and the step of successively performing transcription of the developed pattern formed on one of the pair of original dry plates even times in such a manner that a transcribed pattern having Just formed on a newly supplied dry plate at a prior transcription is now transcribed to a freshly supplied dry plate at a next transcription, and successively performing transcription of the developed pattern formed on the other one of the pair of original dry plate odd times in such a manner that a transcribed pattern having just formed on a newly supplied dry plate at a prior transcription is now transcribed to a freshly supplied dry plate at a next transcription, thereby forming a pair of main plates.

This invention has the technical features that the patterns of a pair of main plates which are closely contacted with both the faces of a member to be exposed to light can be very accurately coincide with each other.

BRIEF DESCRIPTION OF THE DRAWINGS

FIG. 5 is a cross-sectional view of the shadow mask having holes;

FIG. 6 is a cross-sectional view showing the state of a shadow mask material and main plates in which the photo-sensitive layers on both the faces of the shadow mask material are exposed to light;

FIGS. 7A and 7B are drawings explaining a method of manufacturing main plates according to this invention;

FIG. 8 shows a size of openings formed in each of both the faces of a shadow mask material;

FIG. 9A shows a pattern formed on the main plate wherein the steps shown in FIG. 7A are completed, said main plate being depicted so as show its coated surface.

FIG. 9B shows a pattern formed on the main plate wherein the steps shown in FIG. 7B are completed, said main plate being depicted so as to show its coated surface.

FIG. 10 shows a pattern formed on the shadow mask.

DETAILED DESCRIPTION OF THE PREFERRED EMBODIMENTS

Embodiments according to this invention will be explained with reference to the accompanying drawings.

Figure 1A:
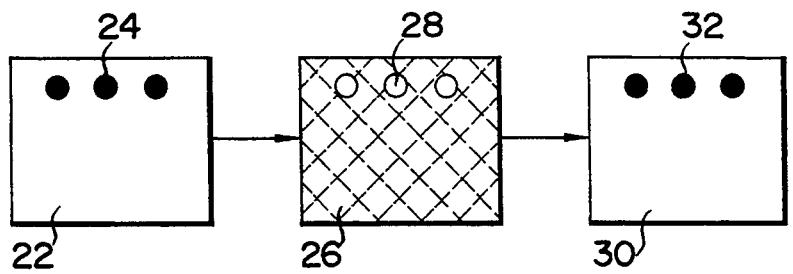
FIGS. 1A and 1B are drawings explaining a conventional method of manufacturing a main plate.
Figure 1B:
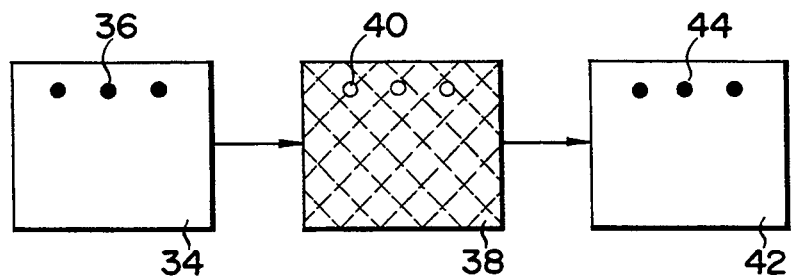
Figure 2:
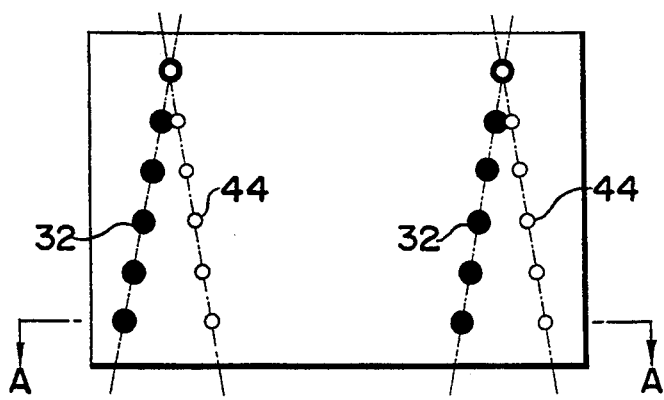
FIG. 2 is a drawing showing the displacement of patterns formed on both the faces of a shadow mask.
Figure 3:
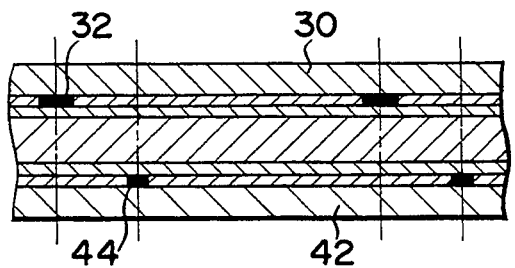
FIG. 3 is a longitudinal cross-sectional view of the shadow mask material together the main plates along line A—A in FIG. 2.
Figure 4:
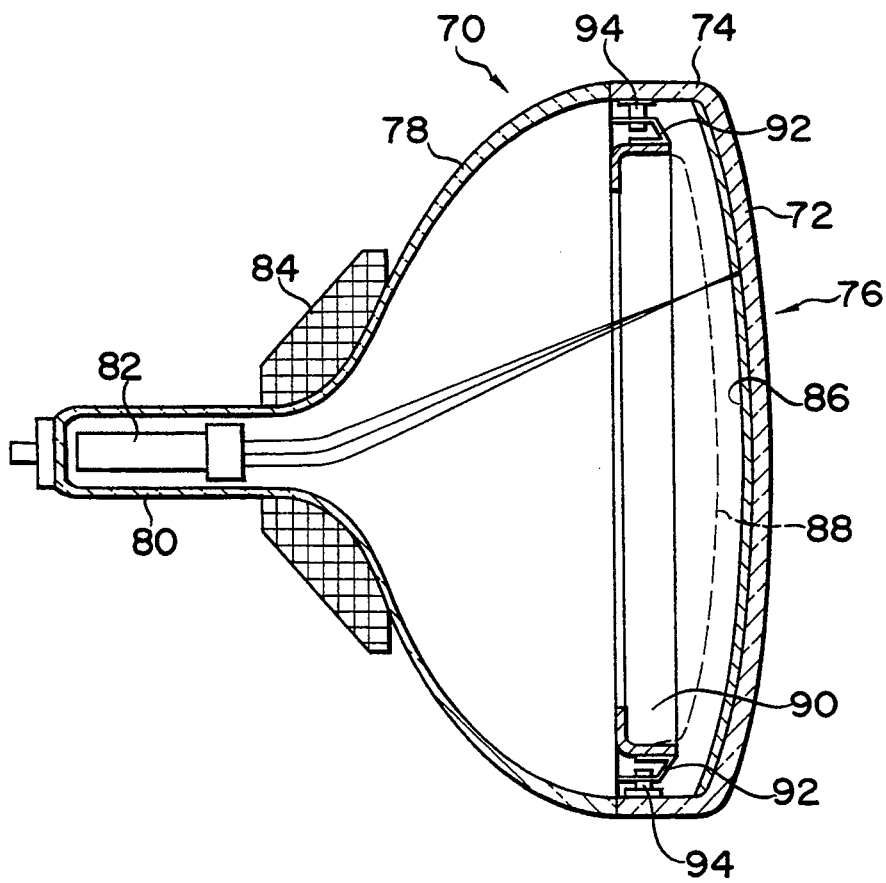
FIG. 4 is a longitudinal cross-sectional view of a cathode ray tube.

FIG. 4 shows a color cathode ray tube having a shadow mask. The tube 70 is provided with a panel 76 having a substantially rectangular face plate 72 and a skirt 74 extending rearward from the periphery of the face plate 72, a funnel 78 connected to the skirt 74 of the panel 76, and a neck 80 formed continuous to the funnel 78. The interior of the color cathode ray tube 70 is held in vacuum by the panel 76, the funnel 78 and the neck 80. In the neck 80 is housed an electron gun assembly 82 which generates three electron beams. A deflection yoke 84 is mounted on the outer surfaces of the funnel 78 and the neck 80. On the inner face of the face plate 72 is formed a phosphor screen 86 which has three kinds of phosphor layers alternately arranged in a stripe manner. The phosphor layers emit red, green or blue light shot by three electron beams, respectively. A substantially rectangular shadow mask 88 made of a thin metal plate having a plurality of apertures is disposed opposed to the phosphor screen 86 in the tube 70. The shadow mask 88 serves to land the three electron beams from the electron gun assembly 82 on the corresponding phosphor layers. A metal mask frame 90 is arranged round the shadow mask 88. A plurality of elastically deformable supports 92 are welded to the mask frame 90. A plurality of panel pins 94 are arranged on the inner face of the skirt 74.

After the three electron beams emitted from the electron gun assembly 82 are deflected vertically and horizontally by the magnetic field generated by the deflection yoke 84, they converge towards the aperture of the shadow mask 88. The electron beams passing the aperture are landed on the phosphor screen 86 formed on the panel 76. The three kinds of layers alternately formed on the phosphor screen 86 emit red, green or blue light after the three electron beams pass the aperture of the shadow mask 88. In other words, the apertures of the shadow mask 88 allot the three electron beams to the predetermined phosphor layers which emit red, green or blue light.

As shown in FIG. 4, the shadow mask 88 has a great number of apertures. FIG. 5 shows a longitudinal cross-sectional view including these apertures 100, each of which has an opening 102 at the side of the phosphor screen and another opening 104 at the side of the electron gun. The opening 102 at the side of the phosphor screen is larger than the opening 104 at the side of the electron gun, and an approximately middle portion of the aperture 100 has the minimum diameter such that the aperture 100 takes a so-called drum shape. This shape enables the electron beams to be reflected to the inner wall of the aperture 100 to prevent them from being shot to the other areas than the phosphor layers.

The apertures 100 of the shadow mask 88 are formed by a photo-etching method. The shadow mask 88 is made of a plate-like shadow mask material 106 of low carbon steel. As shown in FIG. 6, photo-sensitive layers 108 are formed on both the faces of the shadow mask material 106. The layers 108 are closely contacted with a pair of main plates 110 and 111 formed with dot patterns corresponding to the apertures 100 and exposed to light, whereby the patterns of the main plates 110 and 111 are printed on the photo-sensitive layers 108. After developing the photo-sensitive layers 108, the unexposed portions of the photo-sensitive layers 108 are removed. Therefore, resist layers having the patterns corresponding to the patterns of the main plates 110 and 111 are formed on the shadow mask material 106. Thereafter, the apertures 100 penetrating the shadow mask material 106 are opened by etching the material 106 at its both faces.

A pair of main plates will be manufactured as follows:

FIG. 7A shows a method of manufacturing a main plates 110 closely contacted with the face of the shadow mask material 106 at the side of the phosphor screen, and FIG. 7B shows how to fabricate a main plate 111 closely contacted with the face of the shadow mask material 106 at the side of the electron gun.

In FIG. 7A, a dot pattern 114 corresponding the apertures 100 is drawn on an original dry plate 112 having a negative-type emulsion layer by a pattern drawing device (now shown). After developing the dry plate 112, a negative pattern plate 112 is formed. Next, a similar dry plate 116 having a negative-type emulsion layer is closely contacted with the negative pattern plate 112 and printed. Then, the dry plate 116 is developed to produce a positive pattern 118 from which the dry plate 116, used as a master, is made. A dry plate 120 having a negative-type emulsion layer is closely contacted with the dry plate 116 and printed. After the development of the dry plate 120, a pattern plate 120 having a negative pattern 122 is formed. Thus, the pattern plate 120 having negative pattern 122 is formed as the main plate 110.

In FIG. 7B, a dot pattern 126 corresponding the apertures 100 is drawn on an original dry plate 124 having a negative-type emulsion layer by a pattern drawing device (now shown). By developing the dry plate 124, a negative pattern plate 124 is formed. Next, a dry plate 128 having a positive-type emulsion layer is closely contacted at its emulsion face with the negative pattern plate 124. By developing the dry plate 128, a negative pattern 130 is printed to form a pattern plate 128 having negative pattern 130, which is used as a main plate 111.

With the main plates 110 and 111 manufactured by the above method, the apertures 100 can be formed which has a shape and accuracies required for the shadow mask 88.

The shadow mask of a color cathode ray tube, such as a display tube, which requires a high resolution has small apertures arranged at a small pitch.

As shown in FIG. 8, with a pair of main plates 110 and 111 for manufacturing a color cathode ray tube having a high resolution, the displacement tolerance S between the pattern 122 and the pattern 130 is small. The dry plates 112 and 124 on which patterns are drawn by the pattern drawing device are shown in FIGS. 9A and 9B, respectively. Patterns are drawn in turn in the same direction of the order of the rows of the patterns, that is, from the first order to the n'th order ($n > 1$).

When the patterns are drawn on the dry plates 112 and 124 at an angle even slightly different from the angle required for the patterns, the patterns 112 and 114 of the paired main plates 110 and 111 are similarly inclined. When the paired main plates 110 and 111 are used for printing a shadow mask, the emulsion faces in which the patterns are to be formed are closely contacted with the photo-sensitive layers on both the faces of the shadow mask material 106.

FIG. 10 shows a shadow mask material 106, the pattern 120 of a main plate 110 and the pattern 130 of a main plate 111. When the patterns are printed on the shadow mask 106, the main plates are disposed to face each other such that the apertures in the first row on the main plate 110 coincide with the apertures in the first row on the main plate 111. If the rows of the patterns to be formed on the shadow mask material are inclined from the required angle, the inclinations of the rows of the two patterns are same, because the patterns face each other on the respective faces of the shadow mask material. As a result, the positional displacement between the paired etched concave portions formed in both the faces of the shadow mask material is remarkably reduced.

When a shadow mask for a 20-inch color cathode ray tube with a high resolution was manufactured according to this invention, the pattern displacement was less than 3 microns over the whole area of the shadow mask. In this case, the diameter of the dot of the pattern of the main plate was 0.130 mm, the diameter of the dot of the pattern of the main plate 111 was 0.06 mm and the pitch of the dot of the patterns was 0.250 mm.

In the above embodiment, a negative plate having a positive pattern can be made for finding inequality of the patterns. With the above embodiment, a negative dry plate is closely contacted with either the dry plate 124 or the dry plate 128 and then printed, thereby forming the pattern plate having the positive pattern. By using this pattern plate, small deviation of the pattern dimensions and the irregularity of the pattern can be easily detected.

In the above embodiment, the pattern on the main plate 110 bears the aperture images corresponding to the larger apertures at the side of the phosphor screen and the pattern on the other main plate 111 bears the aperture images corresponding to the smaller apertures at the side of the electron gun. However, the scope of this invention is not limited to this arrangement, but the diameters of the aperture images at the side of the phosphor screen and at the side of the electron gun can be reversed.

This method of the invention is not limited to a method of manufacturing main plates for a shadow mask of a color cathode tube, but is applicable to a method of manufacturing a pair of main plates disposed opposite to or closely contacted with photo-sensitive layers formed on both faces of the other kind of plate-like member to be exposed to light.

In summary, a pair of main plates for exposure printing are formed as follows. For the first main plate, a positive pattern is formed from a negative pattern drawn by the photo plotter, the negative pattern of a main plate is formed from this positive pattern by transcribing. For the second main plate, a negative pattern is directly formed from the negative pattern drawn by the photo plotter by using a dry plate having a positive-type emulsion layer. Hence, even when a displacement occurs when the negative patterns are drawn by a photo-plotter, this displacement can be precisely accounted for in making the main plates.

According to this invention, the apertures of a shadow mask are accurately arranged and regularly shaped. This enhances the resolution of a color cathode ray tube having this shadow mask.

What is claimed is:

1. A method of manufacturing a pair of main plates for exposure printing on opposite sides of a shadow mask material, comprising the steps of:
    (a) drawing a first pattern on a first original dry plate and a second pattern on a second original dry plate;
    (b) developing the first and second patterns drawn on said first and second original dry plates;
    (c) transcribing the first pattern developed on said first original dry plate to an intermediate dry plate having a negative-type emulsion layer;
    (d) transcribing the first pattern from said intermediate dry plate to a first dry main plate having a negative-type emulsion layer;
    (e) transcribing the second pattern developed on said second original dry plate to a second dry main plate having a positive-type emulsion layer;
    (f) positioning said first and second dry main plates on opposite sides of the shadow mask material such that said second pattern aligns with said first pattern; and
    (g) transcribing the first and second patterns from said first and second dry main plates to opposite sides of said shadow mask material.

2. The method according to claim 1, wherein said first and second original dry plates are glass dry plates having patterns of negative type.

* * * * *